United States Patent
Lin

(10) Patent No.: US 11,269,720 B2
(45) Date of Patent: Mar. 8, 2022

(54) MEMORY STORAGE APPARATUS AND DATA ACCESS METHOD

(71) Applicant: Winbond Electronics Corp., Taichung (TW)

(72) Inventor: Che-Min Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 78 days.

(21) Appl. No.: 16/537,620

(22) Filed: Aug. 11, 2019

(65) Prior Publication Data

US 2021/0042186 A1 Feb. 11, 2021

(51) Int. Cl.
| | |
|---|---|
| *G06F 11/10* | (2006.01) |
| *G06F 11/14* | (2006.01) |
| *G11C 11/409* | (2006.01) |
| *G06F 13/16* | (2006.01) |
| *H03M 13/29* | (2006.01) |

(52) U.S. Cl.
CPC ...... *G06F 11/1044* (2013.01); *G06F 11/1479* (2013.01); *G06F 13/1668* (2013.01); *G11C 11/409* (2013.01); *H03M 13/2906* (2013.01)

(58) Field of Classification Search
None
See application file for complete search history.

(56) References Cited

U.S. PATENT DOCUMENTS

| | | | | |
|---|---|---|---|---|
| 4,394,763 A | * | 7/1983 | Nagano | G11C 29/70 714/6.1 |
| 6,675,349 B1 | * | 1/2004 | Chen | H03M 13/11 714/758 |
| 7,610,542 B2 | | 10/2009 | Nagai | |
| 8,181,086 B2 | | 5/2012 | Schreck et al. | |
| 8,397,129 B2 | | 3/2013 | Schreck et al. | |
| 8,581,920 B2 | * | 11/2013 | Luo | G09G 5/393 345/563 |
| 9,148,176 B2 | * | 9/2015 | Zhang | G06F 3/064 |
| 9,524,209 B2 | | 12/2016 | Minzoni et al. | |
| 9,690,653 B2 | | 6/2017 | Suzuki | |
| 10,216,573 B2 | * | 2/2019 | Kern | G06F 11/1048 |
| 2012/0198302 A1 | * | 8/2012 | Otterstedt | H03M 13/2906 714/755 |

(Continued)

OTHER PUBLICATIONS

"Office Action of Taiwan Counterpart Application", dated Feb. 5, 2020, p. 1-p. 9.

*Primary Examiner* — April Y Blair
*Assistant Examiner* — Matthew W Wahlin
(74) *Attorney, Agent, or Firm* — JCIPRNET

(57) ABSTRACT

A memory storage apparatus including a memory array and a controller circuit is provided. The memory array is configured to store a first error correcting code and a first data. The controller circuit is coupled to the memory array. The controller circuit is configured to read the first data from the memory array and determine whether an error bit of the first data is one of one or more data mask bits to decide whether to update the first error correcting code stored in the memory array. The controller circuit includes a switch element. The switch element is coupled to the memory array. The switch element receives the first data from the memory array. An error correcting procedure is not performed on the first data. In addition, a data access method is also provided.

14 Claims, 6 Drawing Sheets

(56) References Cited

U.S. PATENT DOCUMENTS

2016/0124803 A1  5/2016  Minzoni
2017/0308299 A1  10/2017 Cha et al.
2019/0146870 A1* 5/2019  Cha .................... G06F 11/1068
                                                714/755

* cited by examiner

MEMORY STORAGE APPARATUS AND DATA ACCESS METHOD

BACKGROUND

Technical Field

The disclosure relates to a memory storage apparatus and a data access method.

Description of Related Art

When an error correction is performed in a dynamic random access memory (DRAM), a controller circuit encodes the originally read data to generate an error correcting code. In the related art, when a write mask is performed in the DRAM, the controller circuit reads the data of the memory cell first before performing the data correction, and then, a new error correcting code is obtained with the data to be written next. The process requires correction of the data originally read from the cell, so the controller circuit needs to be equipped with an error correcting circuit. The error correcting circuit normally occupies a relatively large chip area, and the controller circuit performs an error correcting procedure, which costs a relatively long access time.

SUMMARY

The disclosure provides a memory storage apparatus and a data access method, which have a simple data access process and a relatively fast access speed.

The memory storage apparatus of the disclosure includes a memory array and a controller circuit. The memory array is configured to store a first error correcting code and a first data. The controller circuit is coupled to the memory array. The controller circuit is configured to read the first data from the memory array and determine whether an error bit of the first data is one of one or more data mask bits to decide whether to update the first error correcting code stored in the memory array. The controller circuit includes a switch element. The switch element is coupled to the memory array. The switch element receives the first data from the memory array. An error correcting procedure is not performed on the first data.

In an embodiment of the disclosure, the controller circuit further includes an error correcting code updater. The error correcting code updater is coupled to the memory array. The error correcting code updater is configured to generate a third error correcting code according to a syndrome bit and the second error correcting code to update the first error correcting code. A bit confirmation circuit is coupled to the error correcting code updater. The bit confirmation circuit is configured to determine whether the error bit of the first data is one of the one or the plurality of data mask bits according to a data mask signal and the syndrome bit. If the error bit of the first data is one of the one or the plurality of data mask bits, the bit confirmation circuit outputs an enable signal to enable the error correcting code updater to execute an operation of updating the first error correcting code.

The data access method of the disclosure is for a memory storage apparatus. The memory storage apparatus includes a memory array. The data access method includes the following steps. A first data or a second data is selected as a write data according to a data mask signal, wherein the first data is read from the memory array and an error correcting procedure is not performed on the first data. An error bit of the first data is determined as one of one or more data mask bits or not according to the data mask signal and a syndrome bit. An operation of updating the error correcting code stored in the memory array is executed if the error bit of the first data is one of the one or the plurality of data mask bits.

Based on the above, in the embodiments of the disclosure, the error correcting procedure is not performed on the first data inputted to the switch element, so the data access method has a simple process and a fast access speed.

To make the aforementioned and other features of the disclosure more comprehensible, several embodiments accompanied with drawings are described in detail as follows.

DETAILED DESCRIPTION OF DISCLOSED EMBODIMENTS

Figure 1:
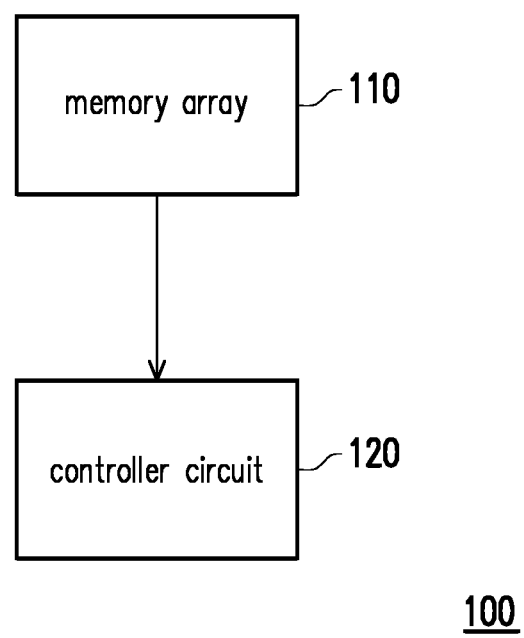
FIG. 1 is a schematic diagram of a summary of a memory storage apparatus according to an embodiment of the disclosure.

FIG. 1 is a schematic diagram of a summary of a memory storage apparatus according to an embodiment of the disclosure. Referring to FIG. 1, a memory storage apparatus 100 of the embodiment includes a memory array 110 and a controller circuit 120. The memory array 110 is configured to store a data and an error correcting code. The controller circuit 120 is coupled to the memory array 110 and is configured to control a data access operation of the memory array 110. In the embodiment, the data access operation refers to, for example, when the data mask is executed, the controller circuit 120 determines whether an error bit of a read data is a data mask bit, if so, the error correcting code stored in the memory array 110 is updated. If the error bit is not a data mask bit, the controller circuit 120 does not update the error correcting code. Using such type of operation mode, the controller circuit 120 may quickly access data.

Figure 2:
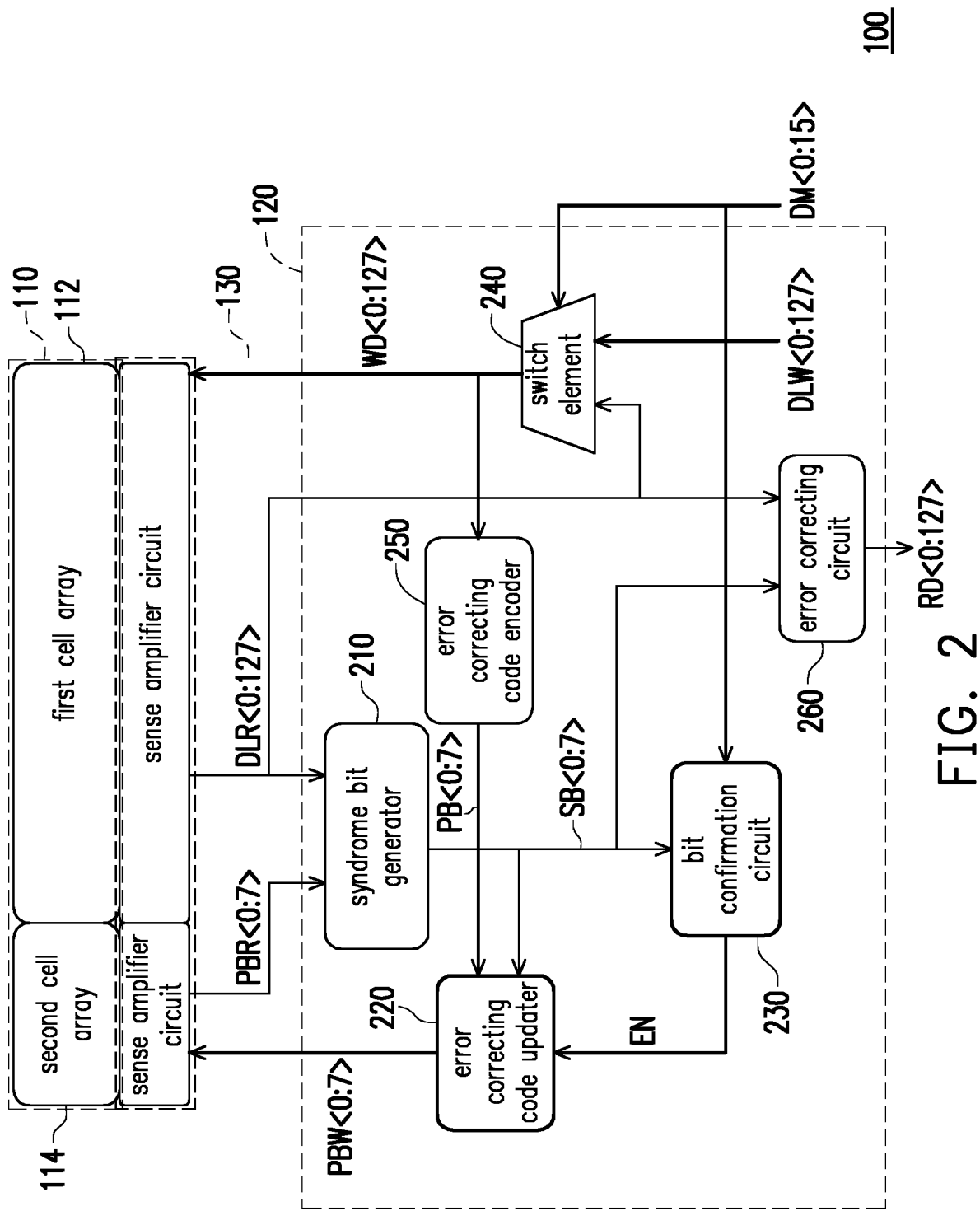
FIG. 2 is a schematic diagram of an inside of the memory storage apparatus of the embodiment of FIG. 1.

FIG. 2 is a schematic diagram of an inside of the memory storage apparatus of the embodiment of FIG. 1. Referring to FIG. 2, the memory array 110 of the embodiment includes a first cell array 112 and a second cell array 114. The first cell array 112 is configured to store a main data and the second cell array 114 is configured to store an error correcting code data. In the embodiment, the error correcting code is, for example, parity bits. In FIG. 2, a sense amplifier circuit 130 disposed between the memory array 110 and the controller circuit 120 is further illustrated. The internal structure, circuit operation, and implementation method thereof can be sufficiently taught, suggested, and implemented by persons with ordinary knowledge in the art.

In the embodiment, the controller circuit 120 is configured to read a first data DLR<0:127> from the first cell array 112. The controller circuit 120 determines whether an error bit of the first data DLR<0:127> is one of data mask bits to decide whether to update a first error correcting code PBR<0:7> stored in the second cell array 114. Specifically, in the embodiment, the controller circuit 120 includes a syndrome bit generator 210, an error correcting code updater 220, a bit confirmation circuit 230, a switch element 240, an error correcting code encoder 250, and an error correcting circuit 260. In an embodiment, the controller circuit 120 may also not include the error correcting circuit 260, that is, the error correcting circuit 260 is disposed outside the controller circuit 120. In general, the error correcting circuit 260 may occupy a relatively large chip area and operate at a power consumption. Therefore, the controller circuit 120 not including the error correcting circuit 260 has a relatively small chip area and is relatively power-saving when performing the data access operation.

The syndrome bit generator 210 reads the first data DLR<0:127> and the first error correcting code PBR<0:7> from the memory array 110, and generates a syndrome bit SB<0:7> according to the first data DLR<0:127> and the first error correcting code PBR<0:7>. The syndrome bit generator 210 outputs the syndrome bit SB<0:7> to the error correcting code updater 220, the bit confirmation circuit 230, and the error correcting circuit 260. The error correcting circuit 260 receives the syndrome bit SB<0:7> and the first data DLR<0:127>, and generates a read data RD<0:127> according to the syndrome bit SB<0:7> and the first data DLR<0:127>. In the embodiment, the internal structure, circuit operation, and implementation method of the syndrome bit generator 210 and the error correcting circuit 260 can be sufficiently taught, suggested, and implemented by persons with ordinary knowledge in the art.

The switch element 240 receives the first data DLR<0:127> and a second data DLW<0:127>. The switch element 240 receives the first data DLR<0:127> from the memory array 110 through the sense amplifier circuit 130, and the first data DLR<0:127> is directly transmitted to the switch element 240 without performing an error correcting procedure. In the embodiment, the error correcting procedure refers to the error correcting circuit 260 executing the error correcting procedure on the first data DLR<0:127> according to the syndrome bit SB<0:7> to generate the read data RD<0:127>. The error correcting procedure executed by the error correcting circuit 260 can be sufficiently taught, suggested, and implemented by persons with ordinary knowledge in the art. The switch element 240 selects the first data DLR<0:127> or the second data DLW<0:127> as a write data WD<0:127> according to a data mask signal DM<0:15>. The write data WD<0:127> is configured to be written to the first cell array 112 and to be outputted from the switch element 240 to the error correcting code encoder 250. In the embodiment, the switch element 240 may be implemented, for example, by one or more multiplexers. The internal structure, circuit operation, and implementation method thereof can be sufficiently taught, suggested, and implemented by persons with ordinary knowledge in the art.

The error correcting code encoder 250 receives the write data WD<0:127> and is configured to generate a second error correcting code PB<0:7> according to the write data WD<0:127>. The error correcting code encoder 250 outputs the second error correcting code PB<0:7> to the error correcting code updater 220. In the embodiment, the internal structure, circuit operation, and implementation method of the error correcting code encoder 250 can be sufficiently taught, suggested, and implemented by persons with ordinary knowledge in the art.

The error correcting code updater 220 receives the syndrome bit SB<0:7> and the second error correcting code PB<0:7>, and is configured to generate a third error correcting code PBW<0:7> according to the syndrome bit SB<0:7> and the second error correcting code PB<0:7.>, and to update the first error correcting code PBR<0:7> stored in the second cell array 114 using the third error correcting code PBW<0:7>.

The bit confirmation circuit 230 determines whether the error bit of the first data DLR<0:127> is one of one or more data mask bits according to the data mask signal DM<0:15> and the syndrome bit SB<0:7>, that is, whether the error bit of the first data DLR<0:127> is in the masked data. If the error bit of the first data DLR<0:127> is the data mask bit, the bit confirmation circuit 230 will output an enable signal EN to enable the error correcting code updater 220 to execute the operation of updating the error correcting code. If the error bit of the first data DLR<0:127> is not the data mask bit, the error correcting code updater 220 does not update the first error correcting code PBR<0:7> stored in the second cell array 114. Therefore, in the embodiment, the first error correcting code PBR<0:7> stored in the second cell array 114 is not updated every time, which simplifies the operation of data access.

Figure 3:
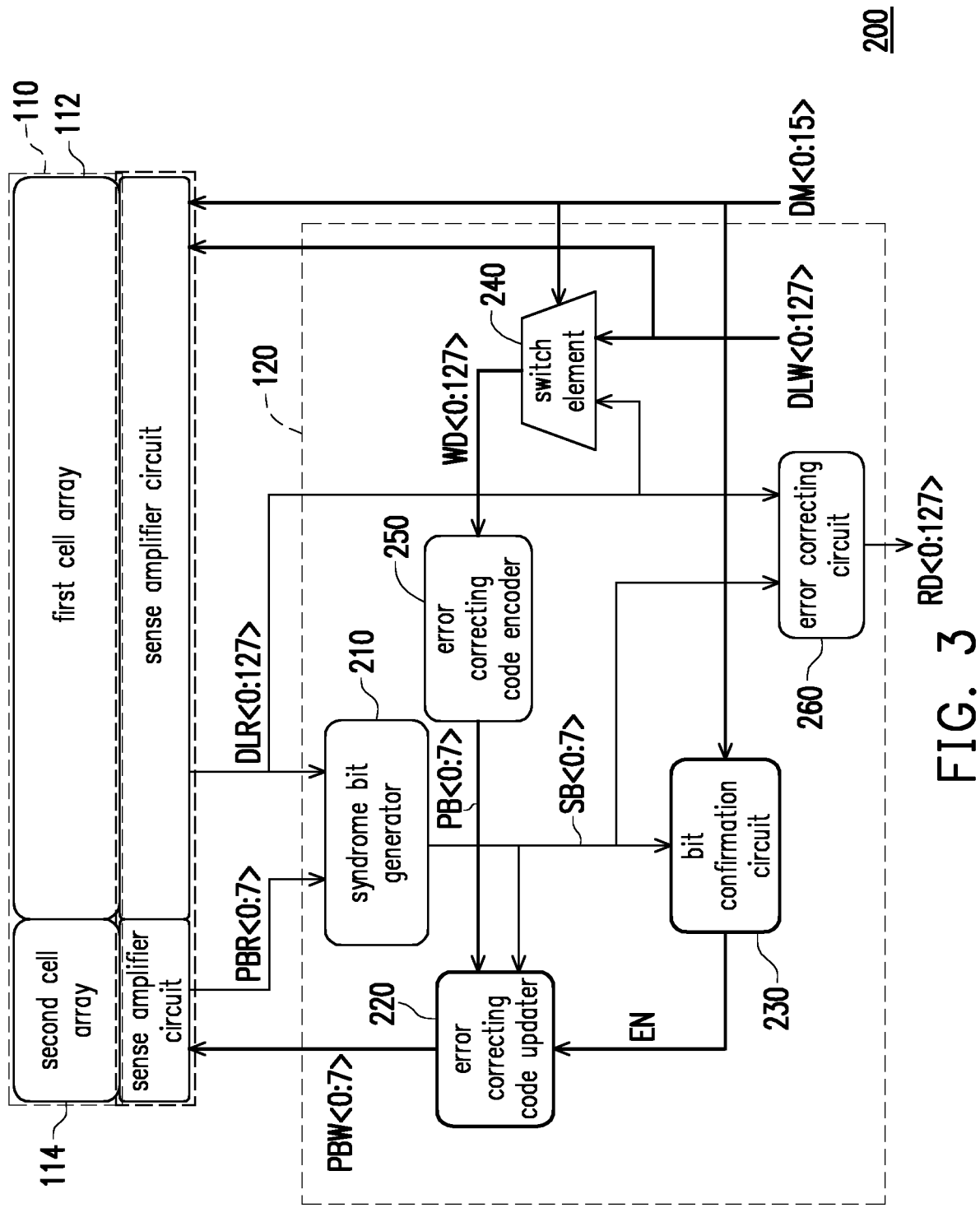
FIG. 3 is a schematic diagram of an inside of a memory storage apparatus according to another embodiment of the disclosure.

FIG. 3 is a schematic diagram of an inside of a memory storage apparatus according to another embodiment of the disclosure. Referring to FIG. 2 and FIG. 3, a memory storage apparatus 200 of the embodiment is similar to the memory storage apparatus 100 of the embodiment of FIG. 2. However, the main difference between the two is, for example, the second data DLW<0:127> and the data mask signal DM<0:15> are directly written to the memory array 110 without going through the switch element 240. Using such type of data access method, if the error bit of the first data DLR<0:127> is not the data mask bit, after the second data DLW<0:127> is written to the memory array 110, the error bit of the first data DLR<0:127> may be directly overwritten and the error bit of the first data DLR<0:127> does not need to be corrected.

Figure 4:
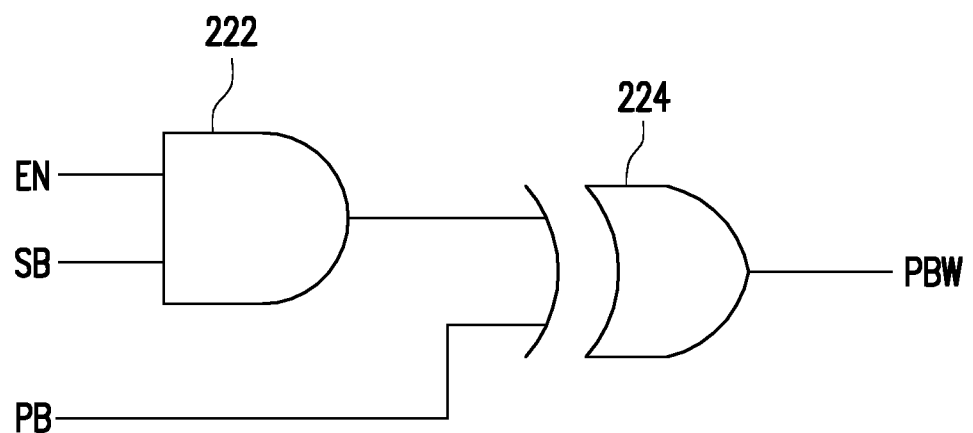
FIG. 4 is a schematic diagram of a circuit of an error correcting code updater according to an embodiment of the disclosure.

FIG. 4 is a schematic diagram of a circuit of an error correcting code updater according to an embodiment of the disclosure. Referring to FIG. 4, the error correcting code updater 220 of the embodiment includes an AND gate 222 and a mutually exclusive OR gate 224. The AND gate 222 receives an enable signal EN and a syndrome bit SB, and generates an output to the mutually exclusive OR gate 224 accordingly. The mutually exclusive OR gate 224 receives the output of the AND gate 222 and a second error correcting code PB, and generates a third error correcting code PBW accordingly. The implementation method of the error correcting code updater 220 of the embodiment is for illustrative purposes only, and the disclosure is not limited thereto. The error correcting code updater 220 may also be implemented with other logic circuit structures.

Figure 5:
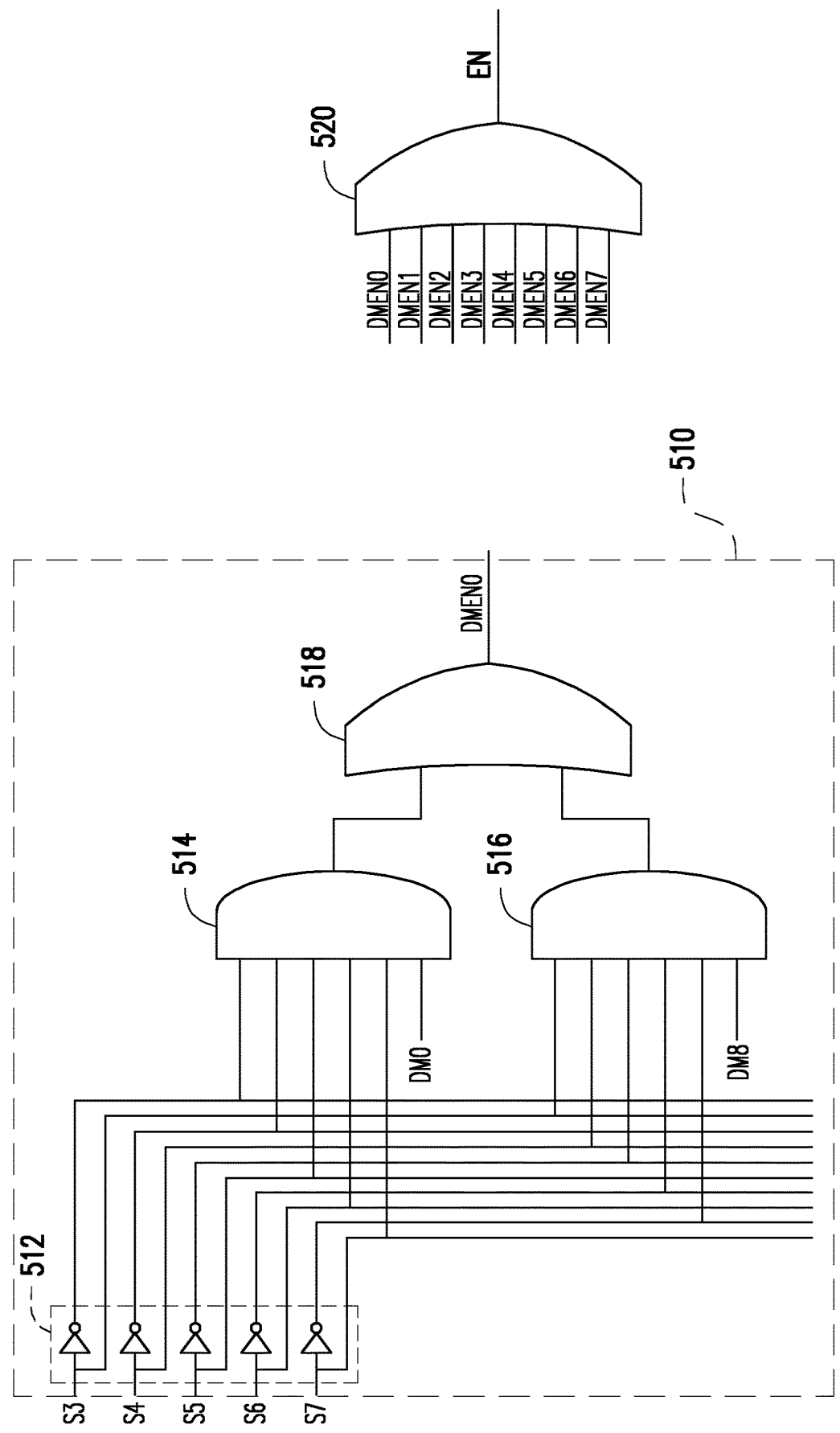
FIG. 5 is a schematic diagram of a circuit of a bit confirmation circuit according to an embodiment of the disclosure.

FIG. 5 is a schematic diagram of a circuit of a bit confirmation circuit according to an embodiment of the disclosure. Referring to FIG. 5, the bit confirmation circuit 230 of the embodiment includes a plurality of logic circuits 510 and an OR gate 520. For simplicity of illustration, FIG. 5 only illustrates one logic circuit 510, and the other logic circuits 510 may be deduced by analogy.

The logic circuit 510 includes an inverter circuit 512, AND gates 514 and 516, and an OR gate 518. A plurality of inverters in the inverter circuit 512 respectively receive bits S3 to S7 in a syndrome bit SB<0:7>. The AND gate 514 receives an output of the inverter circuit 512 and a bit DM0 in a data mask signal DM<0:15>. The AND gate 516 receives an output of the inverter circuit 512 and a bit DM8 in the data mask signal DM<0:15>. The OR gate 518 receives outputs of the AND gates 514 and 516, and generates an output DMEN0 accordingly. On the other hand, other bits DM1 to DM7 and DM9 to DM15 in the data mask signal DM<0:15> are two-by-two inputted to other seven logic circuits 510 to generate corresponding outputs DMEN1 to DMEN7. For example, the bits DM1 and DM9 in the data mask signal DM<0:15> are inputted to another logic circuit 510 to generate the output DMEN1; the bits DM2 and DM10 in the data mask signal DM<0:15> are inputted to another logic circuit 510 to generate the output DMEN2. The outputs DMEN3 to DMEN7 of the other logic circuits 510 may be deduced by analogy.

Next, the OR gate 520 receives the outputs DMEN0 to DMEN7 of the plurality of logic circuits 510, and generates the enable signal EN to the error correcting code updater 220 accordingly. The implementation method of the bit confirmation circuit 230 of the embodiment is for illustrative purposes only, and the disclosure is not limited thereto. The bit confirmation circuit 230 may also be implemented with other logic circuit structures.

Figure 6:
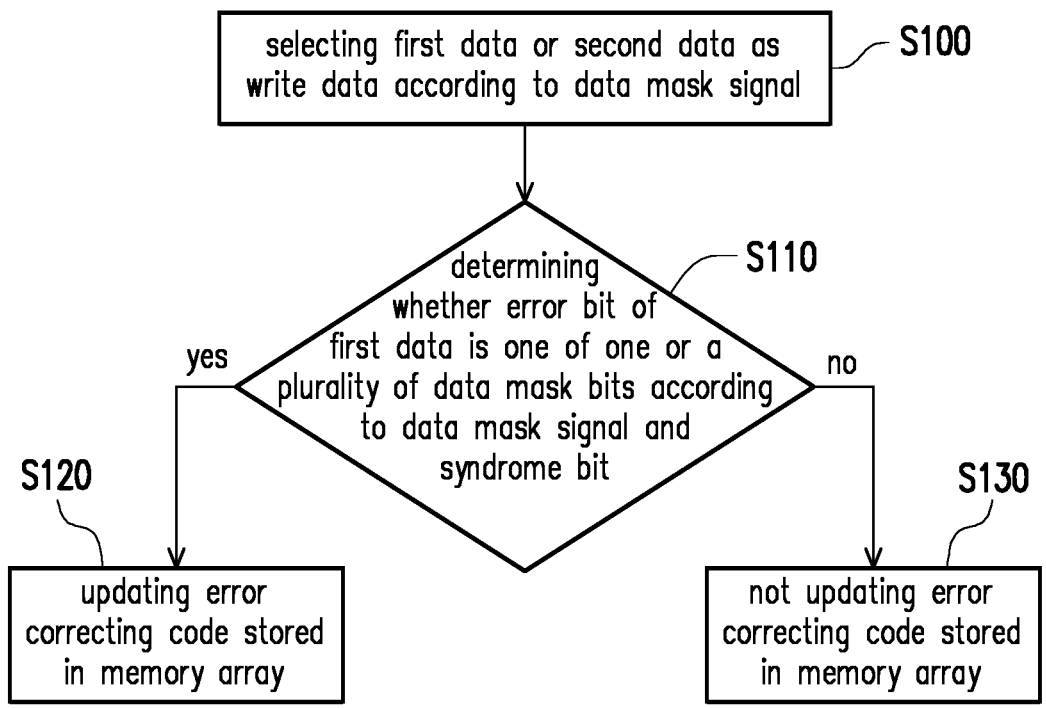
FIG. 6 is a flow diagram of a summary of a data access method according to an embodiment of the disclosure.

FIG. 6 is a flow diagram of a summary of a data access method according to an embodiment of the disclosure. Referring to FIG. 1 and FIG. 6, the data access method of the embodiment is applicable to at least the memory storage apparatus 100 of FIG. 1, but the disclosure is not limited thereto. Taking the memory storage apparatus 100 of FIG. 1 as an example, in Step S100, the controller circuit 120 selects the first data DLR<0:127> or the second data DLW<0:127> as the write data WD<0:127> according to the data mask signal DM<0:15>. In Step S110, the controller circuit 120 determines whether the error bit of the first data DLR<0:127> is one of the one or the plurality of data mask bits according to the data mask signal DM<0:15> and the syndrome bit SB<0:7>. If so, the data access method proceeds to Step S120, and the controller circuit 120 executes the operation of updating the error correcting code PBR<0:7> stored in the memory array 110. If not, the data access method proceeds to Step S130, and the controller circuit 120 does not perform the operation of updating the error correcting code PBR<0:7> stored in the memory array 110. In addition, the data transmission method according to the embodiment of the disclosure can be sufficiently taught, suggested, and implemented from the descriptions of the embodiments from FIG. 2 to FIG. 4.

Based on the above, in the embodiments of the disclosure, the controller circuit determines whether the error bit is the data mask bit to decide whether to update the error correcting code. Therefore, the error correcting code is not updated every time, which simplifies the operation of data access. In addition, if the error bit is not the data mask bit, after the second data is written to the memory array, the error bit of the first data may be directly overwritten and the error bit of the first data does not need to be corrected. In addition, the controller circuit may also not include the error correcting circuit to save chip area and to reduce operational power consumption.

Although the disclosure has been disclosed in the above embodiments, the embodiments are not intended to limit the disclosure. It will be apparent to persons skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory storage apparatus, comprising:
a memory array configured to store a first error correcting code and a first data; and
a controller circuit, coupled to the memory array and configured to read the first data from the memory array and determining whether an error bit of the first data is one of one or more data mask bits to decide whether to update the first error correcting code stored in the memory array, wherein
the controller circuit comprises:
a switch element coupled to the memory array, the switch element receives the first data from the memory array, and an error correcting procedure is not performed on the first data; and
an error correcting code updater, coupled to the memory array, configured to update the first error correcting code stored in the memory array according to an enable signal,
wherein the controller circuit enables the error correction code updater through the enable signal to update the first error correcting code in response to determining that the error bit of the first data is one of one or more data mask bits, and the controller circuit disables the error correcting code updater in response to determining that the error bit of the first data is not the one of one or more data mask bits.

2. The memory storage apparatus according to claim 1, wherein the switch element receives the first data and a second data, and selects the first data or the second data as a write data according to a data mask signal.

3. The memory storage apparatus according to claim 1, wherein
the error correcting code updater is further configured to generate a third error correcting code according to a syndrome bit and a second error correcting code to update the first error correcting code, and
the controller circuit further comprises:
a bit confirmation circuit, coupled to the error correcting code updater and configured to determine whether the error bit of the first data is one of the one or the plurality of data mask bits according to a data mask signal and the syndrome bit, wherein
if the error bit of the first data is one of the one or the plurality of data mask bits, the bit confirmation circuit outputs the enable signal to enable the error correcting code updater to execute an operation of updating the first error correcting code.

4. The memory storage apparatus according to claim 3, wherein the controller circuit further comprises:
an error correcting code encoder, coupled to the error correcting code updater and configured to generate the second error correcting code according to a write data.

5. The memory storage apparatus according to claim 3, wherein the error correcting code updater comprises an AND gate and a mutually exclusive OR gate,
the AND gate receives the enable signal and the syndrome bit and generates an output to the mutually exclusive OR gate, and
the mutually exclusive OR gate receives the output of the AND gate and the second error or correcting code and generates the third error correcting code.

6. The memory storage apparatus according to claim 3, wherein the bit confirmation circuit comprises a plurality of logic circuits and a first OR gate,
the logic circuits receive the data mask signal and generate outputs to the first OR gate, and the first OR gate receives the outputs of the logic circuits and generates the enable signal to the error correcting code updater.

7. The memory storage apparatus according to claim 6, wherein each of the logic circuits comprises an inverter circuit, a plurality of AND gates and a second OR gate, and the inverter circuit comprises a plurality of inverters,
the inverters respectively receive the syndrome bit and generates outputs to the AND gates,
the AND gates receive the outputs of the inverters and the data mask signal and generates outputs to the second OR gate, and
the second OR gate receives the outputs of the AND gates and generates an output to the first OR gate.

8. The memory storage apparatus according to claim 3, wherein the controller circuit further comprises:
a syndrome bit generator, coupled to the bit confirmation circuit configured to generate the syndrome bit according to the first error correcting code and the first data.

9. The memory storage apparatus according to claim 8, wherein the controller circuit further comprises:
an error correcting circuit, coupled to the syndrome bit generator, to execute the error correcting procedure according to the syndrome bit and the first data, so as to generate a read data.

10. The memory storage apparatus according to claim 2, wherein the second data and the data mask signal are directly written to the memory array without going through the switch element.

11. A data access method for a memory storage apparatus, wherein the memory storage apparatus comprises a memory array, the data access method comprising:
selecting a first data or a second data as a write data according to a data mask signal, wherein the first data is read from the memory array and an error correcting procedure is not performed on the first data;
determining whether an error bit of the first data is one of one or more data mask bits according to the data mask signal and a syndrome bit; and
executing an operation of updating a first error correcting code stored in the memory array according to an enable signal, wherein executing the operation of updating the first error correction code comprises:
enabling an error correction code updater of the memory storage apparatus through the enable signal to update the first error correcting code in response to determining that the error bit of the first data is one of one or more data mask bits; and
disabling the error correcting code updater in response to determining that the error bit of the first data is not the one of one or more data mask bits.

12. The data access method according to claim 11, further comprising:
generating a second error correcting code according to the write data.

13. The data access method according to claim 11, further comprising:
generating the syndrome bit according to the first error correcting code and the first data read from the memory array.

14. The data access method according to claim 11, further comprising:
executing the error correcting procedure according to the syndrome bit and the first data read from the memory array to generate a read data.

* * * * *